(12) United States Patent
Imam et al.

(10) Patent No.: US 12,279,455 B2
(45) Date of Patent: Apr. 15, 2025

(54) SEMICONDUCTOR DEVICE AND METHOD OF FABRICATING THE SAME

(71) Applicant: Vanguard International Semiconductor Corporation, Hsinchu (TW)

(72) Inventors: Syed-Sarwar Imam, Bihar (IN); Chih-Cherng Liao, Hsinchu (TW); Chia-Hao Lee, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 480 days.

(21) Appl. No.: 17/947,164

(22) Filed: Sep. 18, 2022

(65) Prior Publication Data

US 2024/0096987 A1 Mar. 21, 2024

(51) Int. Cl.
*H10D 64/27* (2025.01)
*H01L 21/762* (2006.01)
*H10D 30/66* (2025.01)

(52) U.S. Cl.
CPC ..... *H10D 64/513* (2025.01); *H01L 21/76224* (2013.01); *H10D 30/668* (2025.01); *H10D 64/516* (2025.01); *H10D 64/518* (2025.01)

(58) Field of Classification Search
CPC .. H10D 64/513; H10D 64/516; H10D 64/518; H10D 30/668; H01L 29/4236; H01L 29/7813; H01L 29/42368; H01L 29/42376
See application file for complete search history.

(56) References Cited

U.S. PATENT DOCUMENTS

| 9,299,830 | B1* | 3/2016 | Kawahara | H10D 64/513 |
| 2007/0187753 | A1 | 8/2007 | Pattanayak | |
| 2012/0104490 | A1 | 5/2012 | Yilmaz | |
| 2014/0054682 | A1 | 2/2014 | Padmanabhan | |
| 2014/0070852 | A1* | 3/2014 | Saito | H10D 64/117 327/109 |
| 2015/0295080 | A1* | 10/2015 | Lee | H10D 30/0295 438/270 |
| 2017/0148889 | A1 | 5/2017 | Chen | |
| 2018/0212027 | A1* | 7/2018 | Cai | H10D 64/513 |
| 2023/0402518 | A1* | 12/2023 | Park | H10D 64/027 |

FOREIGN PATENT DOCUMENTS

| CN | 113192884 A * | 7/2021 | ......... H01L 21/8232 |
| TW | 202230731 A | 8/2022 | |
| WO | 2005/065385 A2 | 7/2005 | |

\* cited by examiner

*Primary Examiner* — Joseph C. Nicely
(74) *Attorney, Agent, or Firm* — Winston Hsu (57) ABSTRACT

A semiconductor device includes an epitaxial layer, at least one gate trench, and at least one trench gate structure. The gate trench includes a lower gate trench and an upper gate trench, and a width of the lower gate trench is less than a width of the upper gate trench. The trench gate structure is disposed in the gate trench, and the trench gate structure includes a bottom gate structure, a middle gate structure, and a top gate structure. The thickness of the second gate dielectric layer of the middle gate structure is less than the thickness of the first gate dielectric layer of the bottom gate structure. The thickness of the third gate dielectric layer of the top gate structure is less than the thickness of the second gate dielectric layer of the middle gate structure. The first, second, and third gate electrodes are separated from each other.

20 Claims, 10 Drawing Sheets

SEMICONDUCTOR DEVICE AND METHOD OF FABRICATING THE SAME

BACKGROUND OF THE INVENTION

1. Field of the Invention

The present disclosure relates generally to semiconductor technology, and more particularly to semiconductor devices including trench gates and fabrication methods thereof.

2. Description of the Prior Art

Metal-oxide semiconductor field effect transistors (MOSFET) can function as power transistors in integrated circuits, which usually operate under the condition of high voltage and/or high current. Generally, the power MOSFET may be roughly divided into two categories: planar gate MOSFET and trench gate MOSFET.

For the trench gate MOSFET, the gate is usually accommodated in the trench, which has the advantages of smaller footprint and reduced parasitic capacitance. However, in terms of on-state resistance (Ron), breakdown voltage (BVD) and switching loss, the conventional trench gate MOSFET still cannot meet all the requirements for power electronics applications. Therefore, there is still a need to provide a power MOSFET which is able to exhibit both low on-state resistance (Ron) and high breakdown voltage (BVD).

SUMMARY OF THE INVENTION

In view of this, the present disclosure provides semiconductor devices and fabrication methods thereof in order to enhance the electrical performance of the convention semiconductor devices in the prior art.

According to some embodiments of the present disclosure, a semiconductor device includes an epitaxial layer, at least one gate trench, and at least one trench gate structure. The gate trench includes a lower gate trench and an upper gate trench, and a width of the lower gate trench is less than a width of the upper gate trench. The trench gate structure is disposed in the gate trench, and the trench gate structure includes a bottom gate structure, a middle gate structure, and a top gate structure. The bottom gate structure is disposed in a lower portion of the lower gate trench, and the bottom gate structure includes a first gate electrode and a first gate dielectric layer. The middle gate structure is disposed in an upper portion of the lower gate trench, and the middle gate structure includes a second gate electrode and a second gate dielectric layer. The thickness of the second gate dielectric layer is less than the thickness of the first gate dielectric layer. The top gate structure is disposed in the upper gate trench, and the top gate structure includes a third gate electrode and a third gate dielectric layer. The thickness of the third gate dielectric layer is less than the thickness of the second gate dielectric layer. The first gate electrode, the second gate electrode, and the third gate electrode are separated from each other.

According to some embodiments of the present disclosure, a method of fabricating a semiconductor device includes: providing an epitaxial layer; forming an upper gate trench in the epitaxial layer; forming a lower gate trench in the epitaxial layer, where the width of the lower gate trench is less than the width of the upper gate trench; forming a bottom gate structure in a lower portion of the lower gate trench, where the bottom gate structure includes a first gate electrode and a first gate dielectric layer; forming a middle gate structure in an upper portion of the lower gate trench, where the middle gate structure includes a second gate electrode and a second gate dielectric layer, and the thickness of the second gate dielectric layer is less than the thickness of the first gate dielectric layer; and forming a top gate structure in the upper gate trench, where the top gate structure includes a third gate electrode and a third gate dielectric layer, and the thickness of the third gate dielectric layer is less than the thickness of the second gate dielectric layer. The first gate electrode, the second gate electrode, and the third gate electrode are separated from each other.

According to some embodiments of the present disclosure, the first, second, and third gate electrodes are separated from one another and can be biased with different voltages to switch on the channel proximate the trench gate structure. Besides, since the work function of the first, second, and third gate electrodes may be properly modified, the electric field profile around, especially at the bottom of, the trench gate structure can be modified accordingly. As a result, the one-resistance ($R_{ON}$) of the semiconductor device can be reduced, and the breakdown voltage (BVD) can be enhanced. Besides, the transconductance of the semiconductor device can be improved since the gate dielectric layer near the source doped region is thinner than the gate dielectric layer away from the source doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

Figure 1:
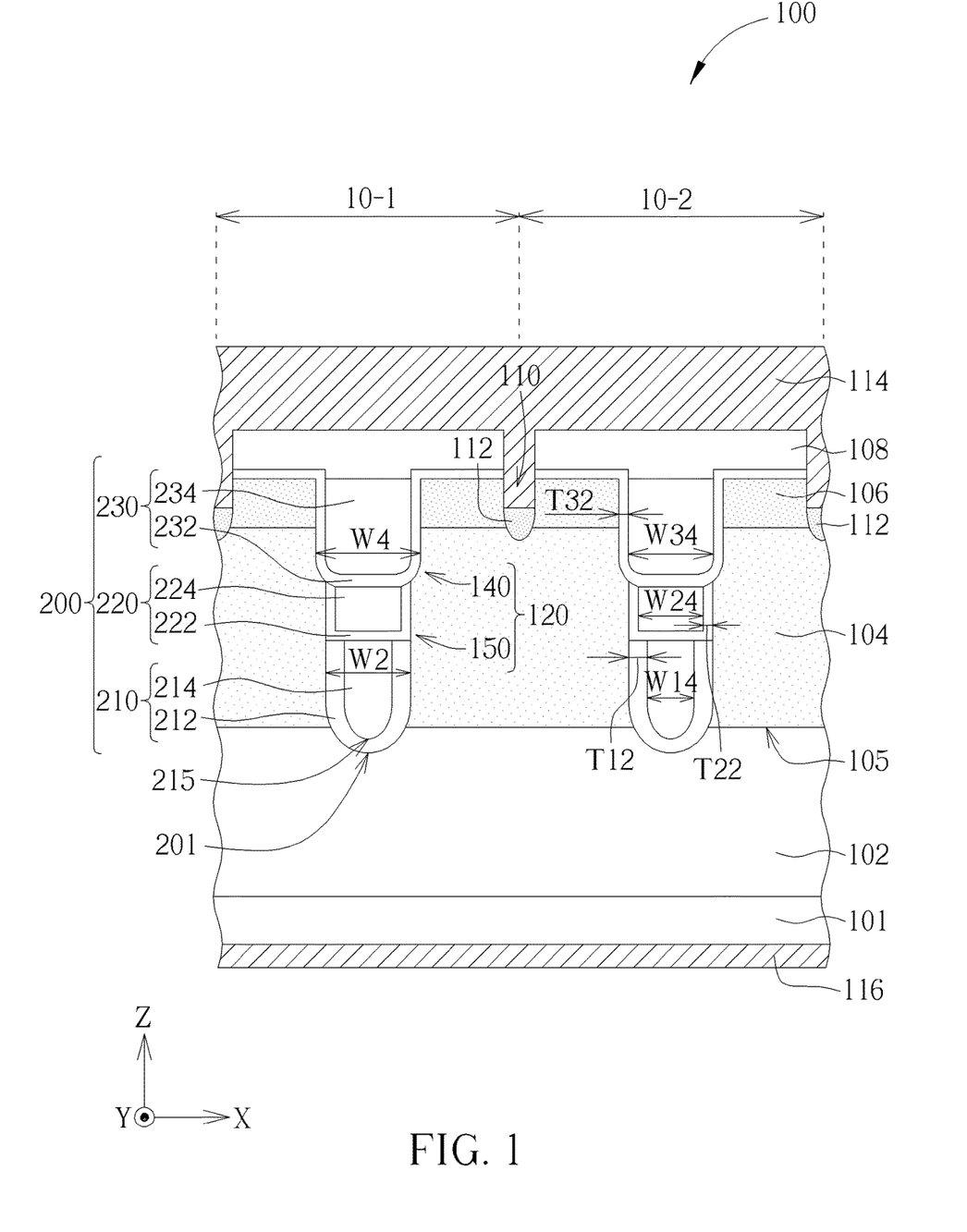
FIG. 1 is a schematic cross-sectional view of a semiconductor device according to some embodiments of the present disclosure.

FIG. 1 is a schematic cross-sectional view of a semiconductor device according to some embodiments of the present disclosure. Referring to FIG. 1, a semiconductor device 100 is provided. In this embodiment, the semiconductor device 100 is a power transistor which is able to operate in high working voltage such as 100-500 volts and/or in high working current such as 0.1-100 amperes, but not limited thereto. The semiconductor device 100 includes a substrate 101 of a first conductivity type such as n-type. The substrate 101 is made of semiconductor material, such as Si, SiC, AlN, GaN or other suitable semiconductor material, and the substrate 101 can function as a drain region of the semiconductor device 100. An epitaxial layer 102 is disposed on the substrate 101. The epitaxial layer 102 can be made of Si, GaN, SiC or other suitable material. A body doped region 104 of second conductivity type such as p-type can be formed in an upper portion of the epitaxial layer 102. A source doped region 106 is formed in the epitaxial layer 102 (or in the body doped region 104) and proximate an upper surface of the epitaxial layer 102. The source doped region 106 is of a second conductivity type such as p-type which is different from the first conductivity type of the body doped region 104. A cap dielectric layer 108 is disposed on the source doped region 106. A source contact hole 110 is formed in the cap dielectric layer 108, and the bottom surface of the source contact hole 110 is lower than the top surface of the source doped region 106. A heavily doped region 112 of the second conductivity type such as p-type is formed under the source contact hole 110 and between two adjacent trench gate structures 200, and the dopant concentration of the heavily doped region 112 is greater than the dopant concentration of the body doped region 104. A source contact 114 is formed on the cap dielectric layer 108 and filled into the source contact hole 110. The source contact 114 is electrically connected to the source doped region 106 by the source contact 114 disposed in the source contact hole 110. The semiconductor device 100 may further include a drain contact 116 disposed on the back surface of the substrate 101 so that the drain contact 116 is disposed under the trench gate structure 200.

Referring to FIG. 1, at least one gate trench 120 is disposed in the epitaxial layer 102. In some embodiments, there are two gate trenches 120 disposed in a first region 10-1 and a second region 10-2 of the semiconductor device 100, respectively. The sidewalls of each of the gate trenches 120 can be covered with the body doped region 104 or the source doped region 106, and a lowest surface 201 of the gate trench 120 is lower than a bottom surface 105 of the body doped region 104. Each gate trench 120 can extend along a first direction (i.e. Y direction) which is parallel to the main surface of the substrate 101. Each gate trench 120 includes at least two sub-trenches such as an upper gate trench 140 and a lower gate trench 150. The lower gate trench 150 is arranged below the upper gate trench 140, and the width W2 (i.e. along a second direction X) of the lower gate trench 150 is less than the width W4 (i.e. along a second direction X) of the upper gate trench 140. In some embodiments, the lower gate trench 150 can include vertical sidewalls and curved bottom surface. The entirety of the vertical sidewalls of the lower gate trench 150 is fully covered with the body doped region 104, and portions of the curved bottom surface of the lower gate trench 150 can be deeper than the bottom surface 105 of the body doped region 104.

The upper gate trench 140 is arranged over the lower gate trench 150 and includes vertical sidewalls and curved lower corners which connect upper edges of the lower gate trench 150. An upper portion of the vertical sidewalls of the upper gate trench 140 can be covered with the source doped region 106, and a lower portion of the vertical sidewalls of the upper gate trench 140 can be covered with the body doped region 104.

The semiconductor 100 also includes at least one trench gate structure 200 such as two trench gate structures 200 which are disposed in the gate trenches 120, respectively. Each trench gate structure 200 can include a bottom gate structure 210, a middle gate structure 220, and a top gate structure 230 arranged from bottom to top. The bottom gate structure 210 is disposed in a lower portion of the lower gate trench 150, and the bottom gate structure 210 includes a first gate dielectric layer 212 and a first gate electrode 214. The first gate dielectric layer 212 includes a vertical portion with a thickness T12, and the first gate electrode 214 has a width W14. The bottom portion of the first gate dielectric layer 212 may have a thickness the same as or greater than the thickness T12 of the vertical portion the first gate dielectric layer 212 based on various requirements. The first gate dielectric layer 212 may be made of silicon oxide or high-k (>4) dielectric layer, but not limited thereto. The lowest surface 215 of the first gate electrode 214 is lower than the bottom surface 105 of the body doped region 104. The first gate electrode 214 may be made of conductive material such as polysilicon or metal material, but not limited thereto. In order to modify threshold voltage ($V_{TH}$) of the channel in the body doped region 104 proximate the bottom gate structure 210, the work function of the first gate electrode 214 can be adjusted by implanting suitable dopants to the first gate electrode 214 or using suitable material to construct the first gate electrode 214.

The middle gate structure 220 is disposed in an upper portion of the lower gate trench 150, and the middle gate structure 220 includes a second gate dielectric layer 222 and a second gate electrode 224. The second gate dielectric layer 222 can be disposed on the sidewalls and the bottom surface of the second gate electrode 224. In other words, the second gate dielectric layer 222 can extend from below the second gate electrode 224 to the sidewalls of the lower gate trench 150. Besides, the second gate dielectric layer 222 includes a vertical portion with a thickness T22. In this embodiment, the thickness T22 of the second gate dielectric layer 222 is less than the thickness T12 of the first gate dielectric layer 212. The second gate dielectric layer 222 may be made of silicon oxide or high-k (>4) dielectric layer, but not limited thereto. The bottom surface of the second gate electrode 224 is higher than the bottom surface 105 of the body doped region 104. Also, the second gate electrode 224 has a width W24 which is greater than the width W14 of the first gate electrode 214. The second gate electrode 224 may be made of conductive material such as polysilicon or metal material, but not limited thereto. In order to modify threshold voltage ($V_{TH}$) of the channel in the body doped region 104 proximate the middle gate structure 220, the work function of the second gate electrode 224 can be adjusted by adding dopants to the second gate electrode 224 or using suitable material to construct the second gate electrode 224.

The top gate structure 230 is disposed in the upper gate trench 140, and includes a curved lower corner extending beyond an upper edge of the middle gate structure 220. The top gate structure 230 includes a third gate dielectric layer 232 and a third gate electrode 234. The third gate dielectric layer 232 can be disposed on the sidewalls and the bottom surface of the third gate electrode 234. In other words, the third gate dielectric layer 232 can extend from below the third gate electrode 234 to the sidewalls of the upper gate trench 140. Besides, the third gate dielectric layer 232 includes a vertical portion with a thickness T32. In this embodiment, the thickness T32 of the third gate dielectric layer 232 is less than the thickness T22 of the second gate dielectric layer 222. The third gate dielectric layer 232 may be made of silicon oxide or high-k (>4) dielectric layer, but not limited thereto. The top surface of the third gate electrode 234 is higher than the bottom surface of the source doped region 106, and the third gate electrode 234 includes a curved lower corner which is lower than the bottom surface of the source doped region 106. The third gate electrode 234 has a width W34 which is greater than the width W24 of the second gate electrode 224. The third gate electrode 234 may be made of conductive material such as polysilicon or metal material, but not limited thereto. In order to modify threshold voltage ($V_{TH}$) of the channel in the body doped region 104 proximate the top gate structure 230, the work function of the third gate electrode 234 can be adjusted by adding dopants to the third gate electrode 234 or using suitable material to construct the third gate electrode 234. Besides, the transconductance of the semiconductor device 100 can be improved since the gate dielectric layer near the source doped region (i.e. the third gate dielectric layer 232) is thinner than the gate dielectric layer away from the source doped region (i.e. the first and second gate dielectric layers 212, 222).

In some embodiments of the present disclosure, the first gate electrode 214, the second gate electrode 224, and the third gate electrode 234 are separated from each other. Besides, the work function of one of the first, second, and third gate electrodes 214, 224, 234 is different from work function of other two of the first, second, and third gate electrodes 214, 224, 234.

In some embodiments of the present disclosure, each trench gate structure 200 includes three discrete gate electrodes (i.e. first, second, and third gate electrodes 214, 224, 234) and three gate dielectric layers (i.e. first, second, and third gate dielectric layers 212, 222, 232) with various thicknesses (i.e. thicknesses T12, T22, T32). Therefore, during operation of the semiconductor device 100, the first, second, and third gate electrodes 214, 224, 234 can be biased with different voltages to switch on the channel proximate the trench gate structure 200 and thereby let current flow from the drain contact 116 to the source doped region 106 and the source contact 114. Besides, since the work function of the first, second, and third gate electrodes 214, 224, 234 may be properly modified, the electric field profile around, especially at the bottom of, the trench gate structure 200 can be modified accordingly. For example, compared with a conventional trench gate MOSFET having single gate electrode in respective gate trench, the peak electric field at the bottom of the trench gate structure 200 of the semiconductor device 100 can be reduced by at least 18.5%. As a result, in some embodiments, the one-resistance ($R_{ON}$) of the semiconductor device 100 can be lowered by at least 33.2%, and the breakdown voltage (BVD) can be enhanced by at least 6%.

In order to enable one of ordinary skill in the art to implement the present disclosure, a method of fabricating a semiconductor device of the present disclosure is further described below.

Figure 2:
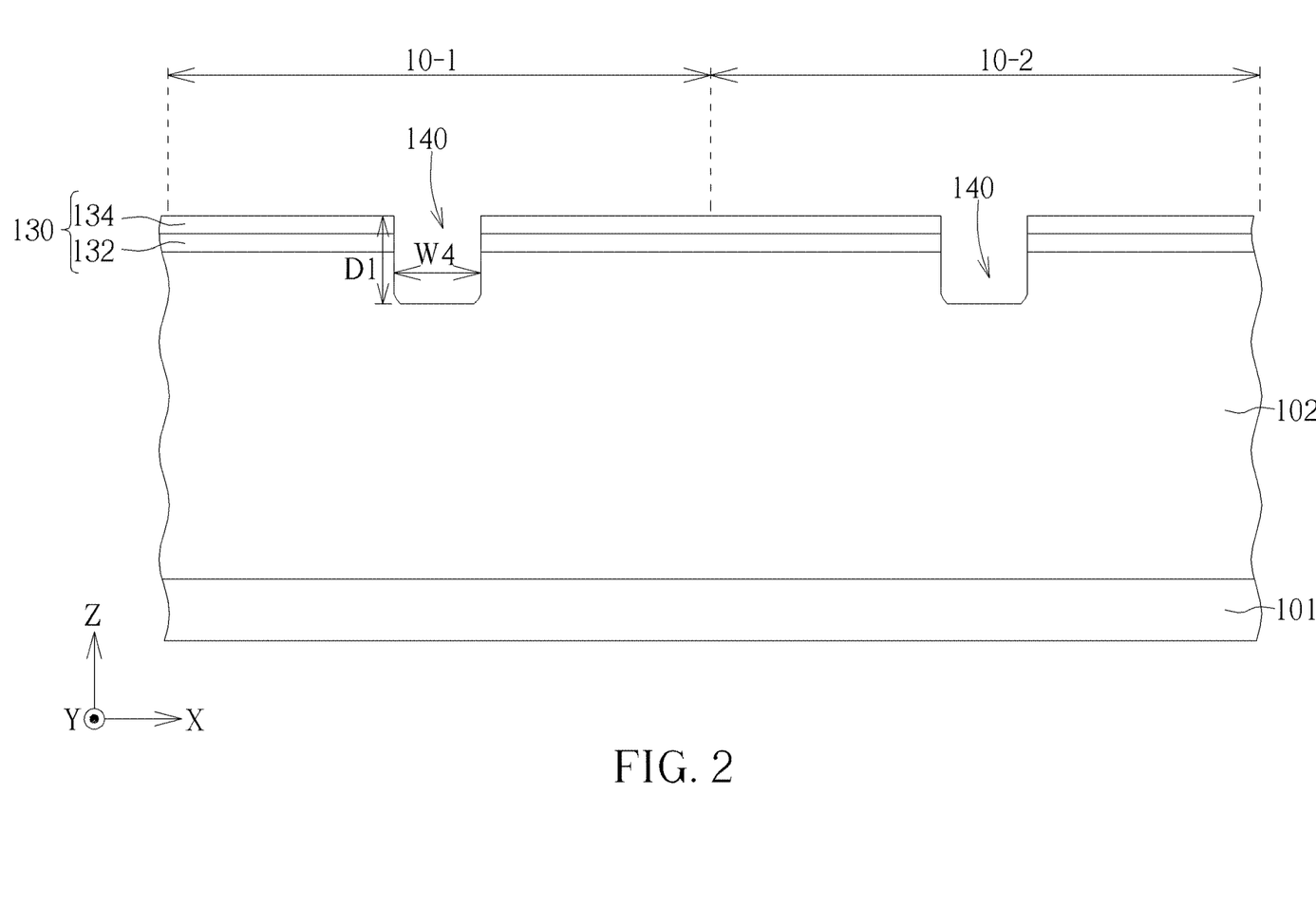
FIG. 2 to FIG. 10 are schematic cross-sectional views of intermediate stages of a method of fabricating a semiconductor device according to some embodiments of the present disclosure.

FIG. 2 to FIG. 10 are schematic cross-sectional views of intermediate stages of a method of fabricating a semiconductor device according to some embodiments of the present disclosure. Referring to FIG. 2, at a stage of manufacture shown in FIG. 2, an epitaxial layer 102 is form on a substrate by an epitaxy growth method. The epitaxial layer 102 can be made of semiconductor material with a first conductivity such as n-type. A patterned mask layer 130 including a bottom layer 132 and a top layer 134 can be formed on the upper surface of the epitaxial layer 102. The portions of the epitaxial layer 102 exposed from the patterned mask layer 130 can be etched to thereby form at least one trench in the epitaxial layer 102. In some embodiments, the at least one trench formed in the epitaxial layer 102 includes two upper gate trenches 140 respectively formed in a first region 10-1 and a second region 10-2. Each upper gate trench 140 has a depth D1 and a width W4.

Figure 3:
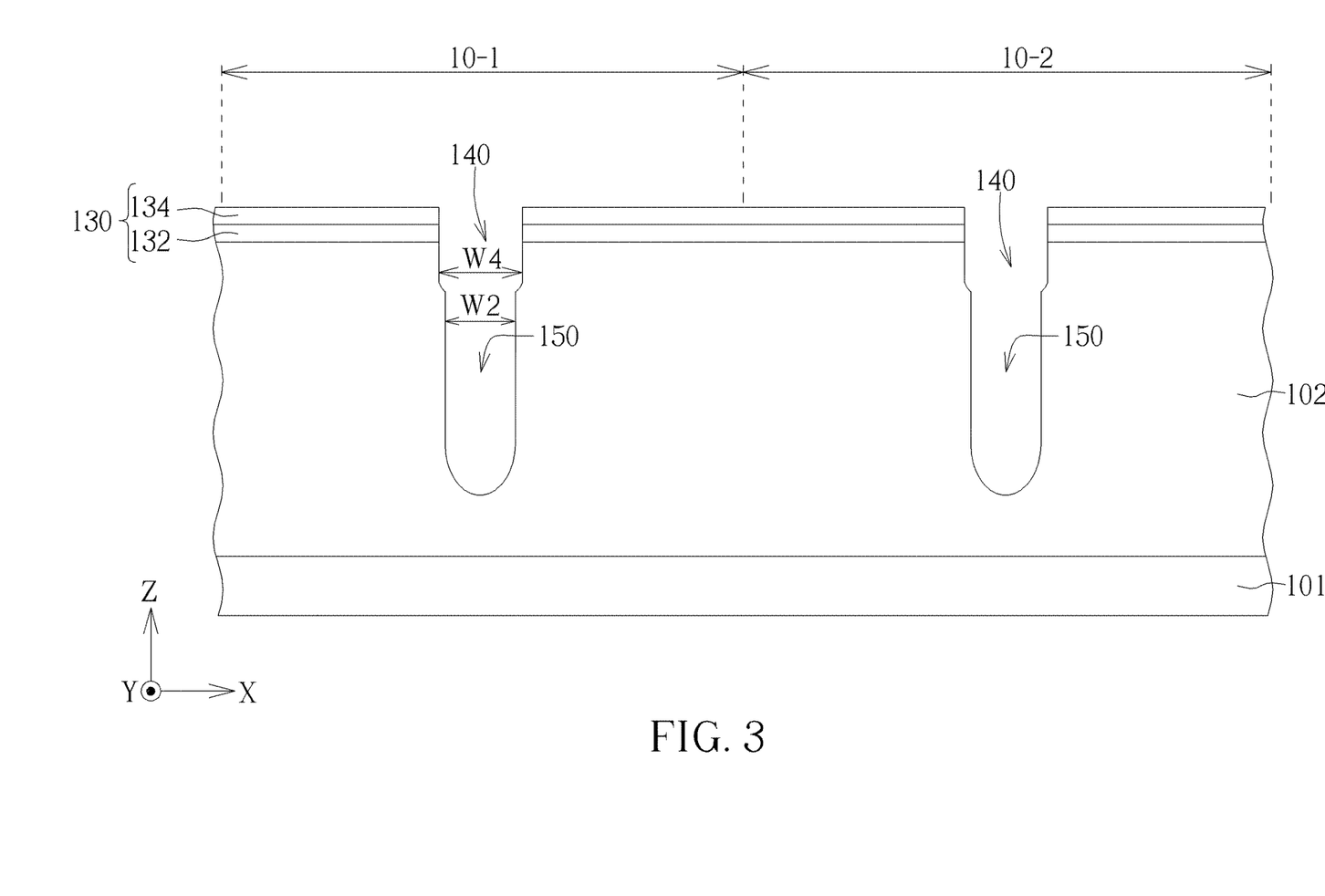

Referring to FIG. 3, at a stage of manufacture shown in FIG. 3, photolithography and etching processes are performed to form a lower gate trench 150 below respective upper gate trench 140. The width W2 of the lower gate trench 150 is less than the width W4 of the upper gate trench 140. Besides, the upper gate trench 140 has curved lower corners respectively connecting the upper edges of the lower gate trench 150.

Figure 4:
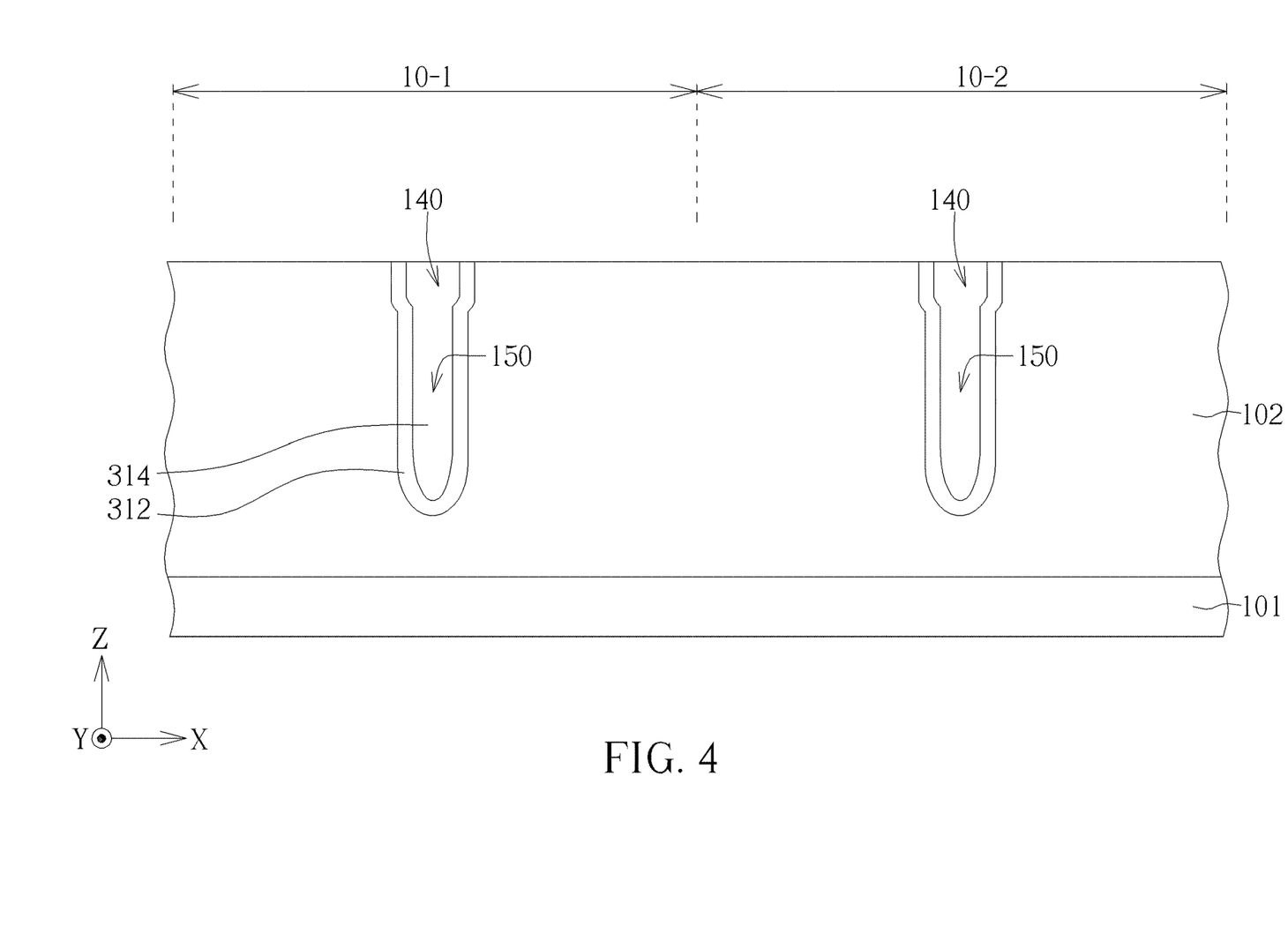

Referring to FIG. 4, at a stage of manufacture shown in FIG. 4, a deposition process is performed to form a layer of dielectric material 312 on the sidewalls of the upper gate trench 140 and the lower gate trench 150. Then, the upper gate trench 140 and the lower gate trench 150 are filled with a conductive material 314. The conductive material 314 can be made of semiconductor material or metal material depending on actual requirements. Besides, the work function of the conductive material 314 may be modified to a predetermined value by using a suitable material or implanting suitable dopants.

Figure 5:
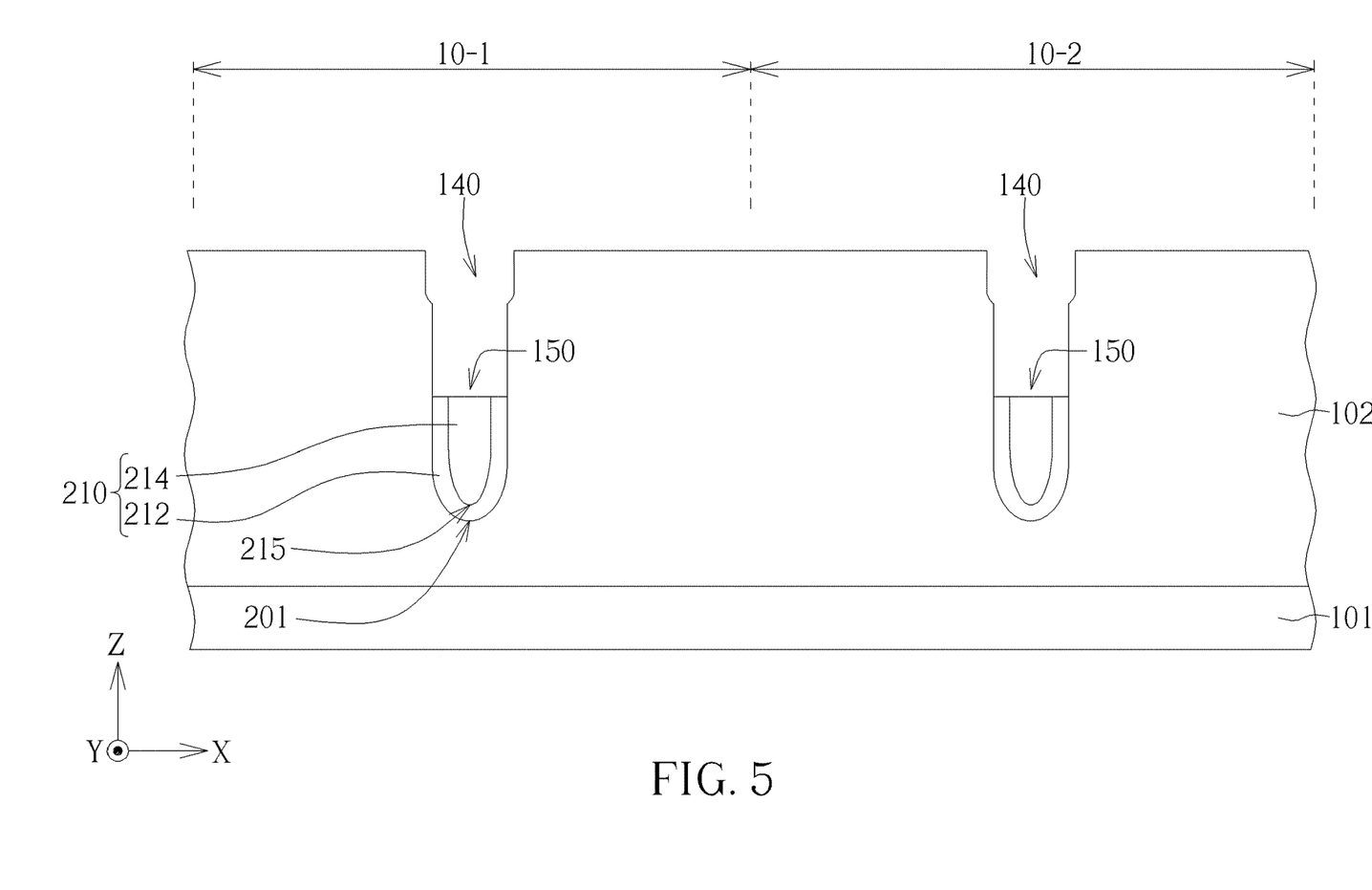

Referring to FIG. 5, at a stage of manufacture shown in FIG. 5, a bottom gate structure 210 is formed by etching back the dielectric material 312 and the conductive material 314 in the upper gate trench 140 and the lower gate trench 150 shown in FIG. 4. For example, the dielectric material 312 and the conductive material 314 in the upper gate trench 140 and the lower gate trench 150 can be etched back until the top surfaces of the dielectric material 312 and the conductive material 314 are in the lower gate trench 150. By performing the etching back process, the bottom gate structure 210 including a first gate dielectric layer 212 and a first gate electrode 214 can be obtained. Besides, the first gate dielectric layer 212 and the first gate electrode 214 can have lowest surfaces 201, 215, respectively.

Figure 6:
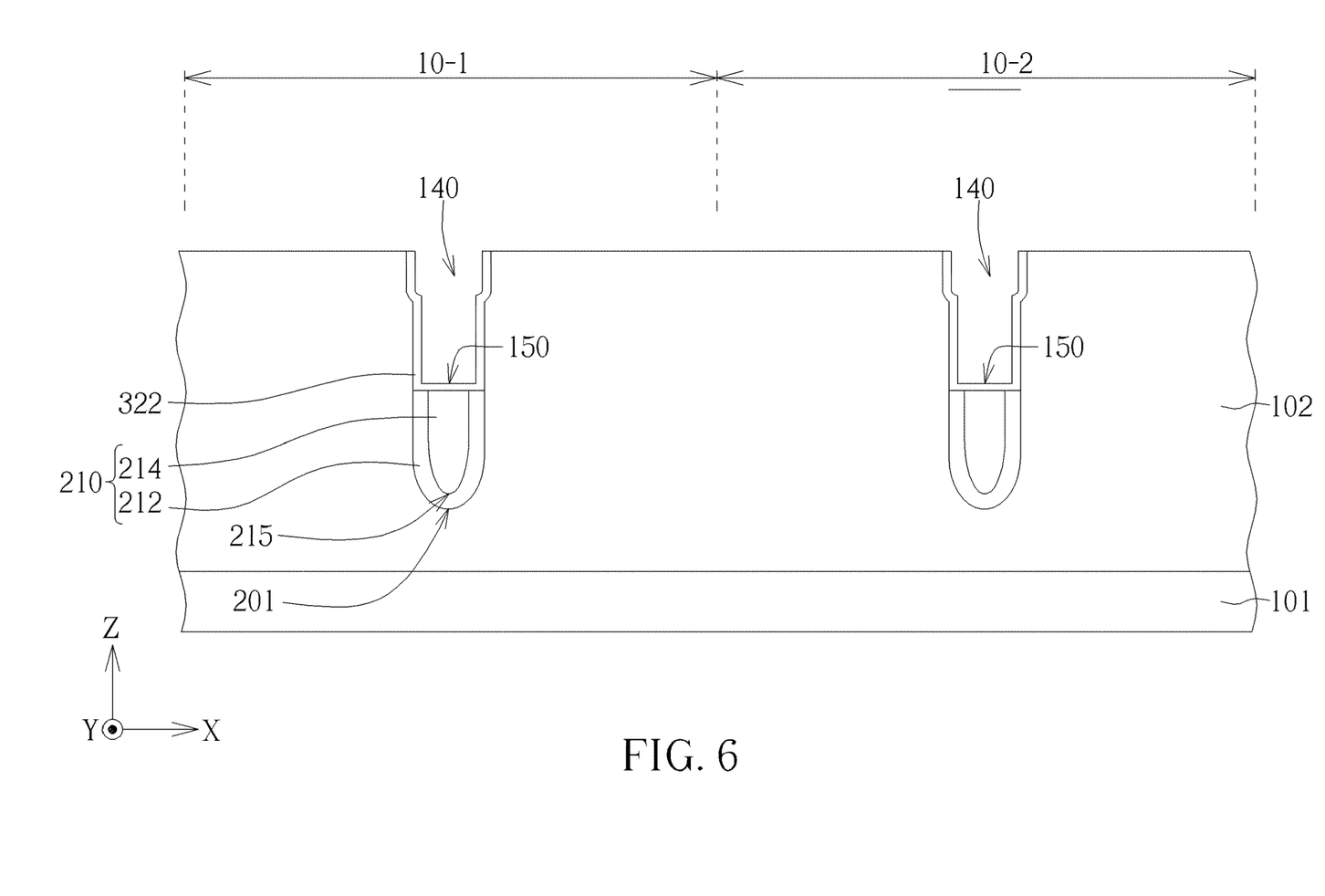

Referring to FIG. 6, at a stage of manufacture shown in FIG. 6, a deposition process is performed to form a layer of dielectric material 322 on the sidewalls of the upper gate trench 140 and the lower gate trench 150, and on the top surface of the bottom gate structure 210. The layer of dielectric material 322 have a thickness less than the thickness of the first gate dielectric layer 212.

After the stage of manufacture shown in FIG. 6, a conductive material (not shown) is filled into the upper portion of the lower gate trench 150 and into the upper gate trench 140. The conductive material can be made of semiconductor material or metal material depending on actual requirements. Besides, the work function of the conductive material may be modified to a predetermined value by using a suitable material or implanting suitable dopants.

Figure 7:
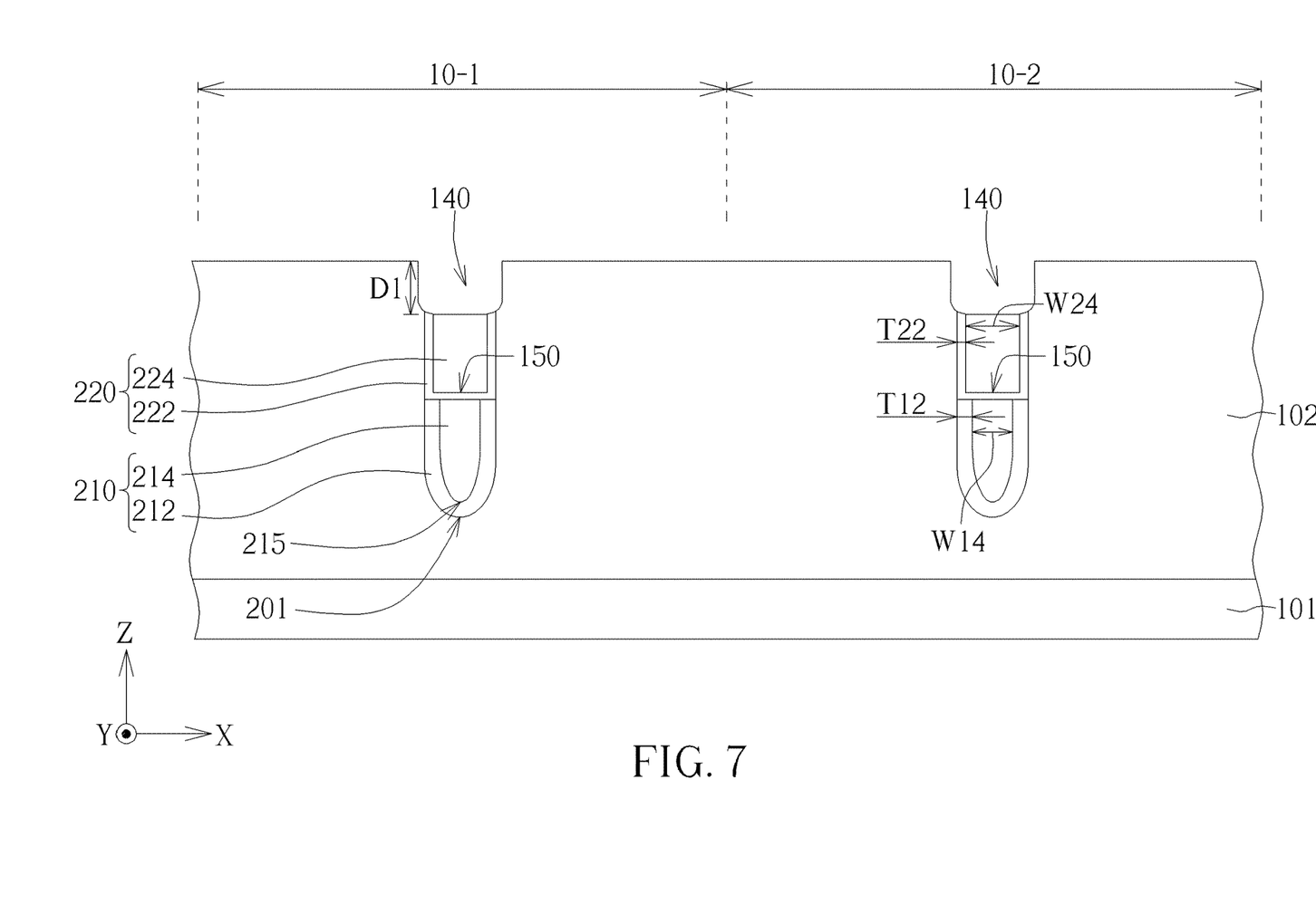

Referring to FIG. 7, at a stage of manufacture shown in FIG. 7, a middle gate structure 220 is formed in an upper portion of the lower gate trench 150 by etching back the dielectric material and the conductive material filled in the upper gate trench 140 and the lower gate trench 150. By performing the etching back process, the sidewalls of the upper gate trench 140 can be exposed, and the top surface of the middle gate structure 220 is substantially level with the bottom surface of the upper gate trench 140. The middle gate structure 220 includes a second gate dielectric layer 222 and a second gate electrode 224. In some embodiments, the thickness T12 of the first gate dielectric layer 212 is greater than the thickness T22 of the second gate dielectric layer 222, and the width W14 of the first gate electrode 214 is less than the width W24 of the second gate electrode 224.

Figure 8:
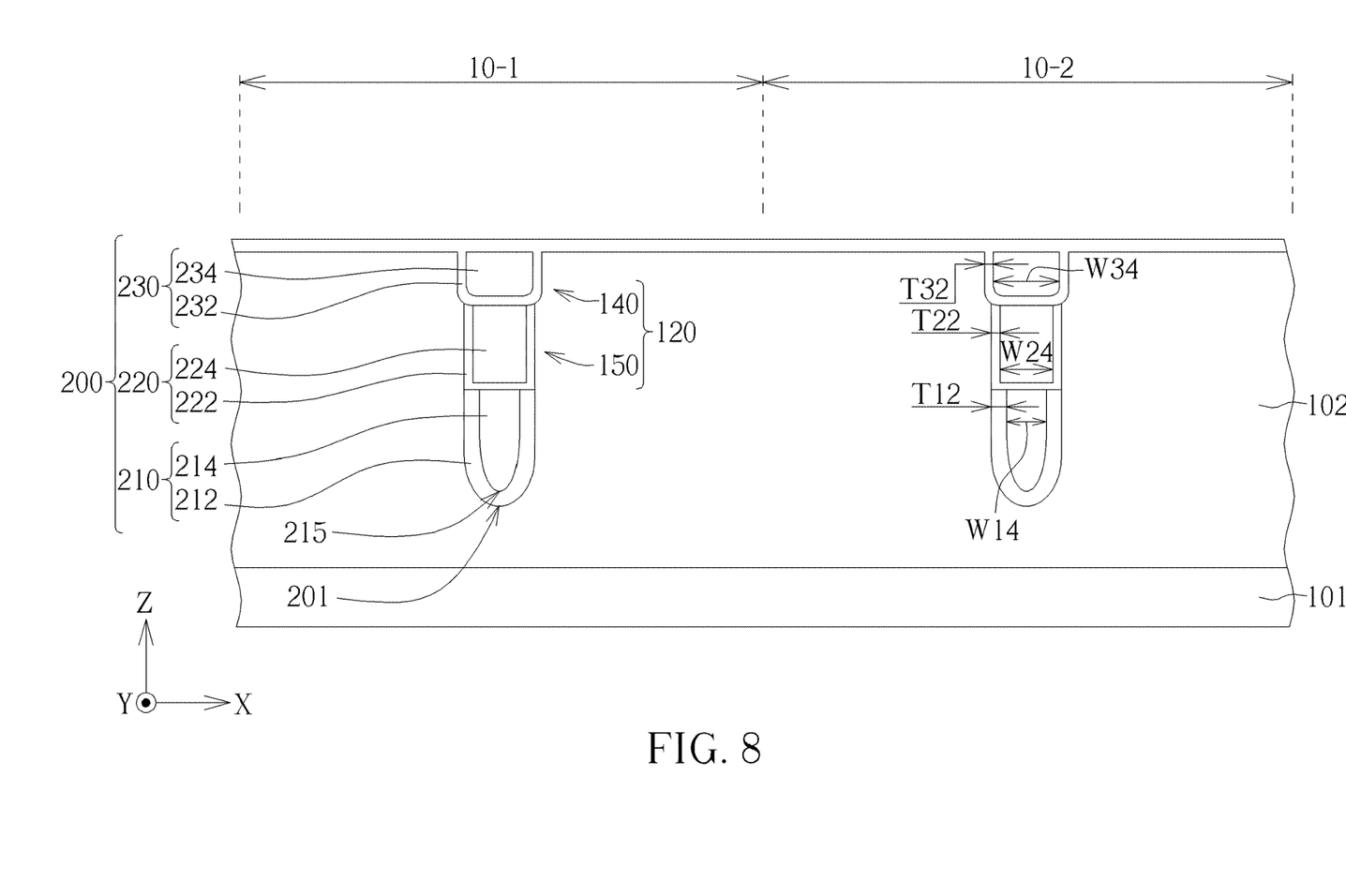

Referring to FIG. 8, at a stage of manufacture shown in FIG. 8, a top gate structure 230 including a third gate dielectric layer 232 and a third gate electrode 234 is formed in the upper gate trench 140. In some embodiments, the top gate structure 230 includes a curved lower corner extending beyond an upper edge of the middle gate structure 220. The third gate dielectric layer 212 has a thickness T32 less than the thickness T22 of the second gate dielectric layer 222. The third gate electrode 234 includes a curved lower corner, and the width W34 of the third gate electrode 234 is greater than the width W24 of the second gate electrode 224. In some embodiments, the first gate electrode 214, the second gate electrode 224, and the third gate electrode 234 are separated from each other. Besides, the work function of one of the first, second, and third gate electrodes 214, 224, 234 is different from work function of other two of the first, second, and third gate electrodes 214, 224, 234.

Figure 9:
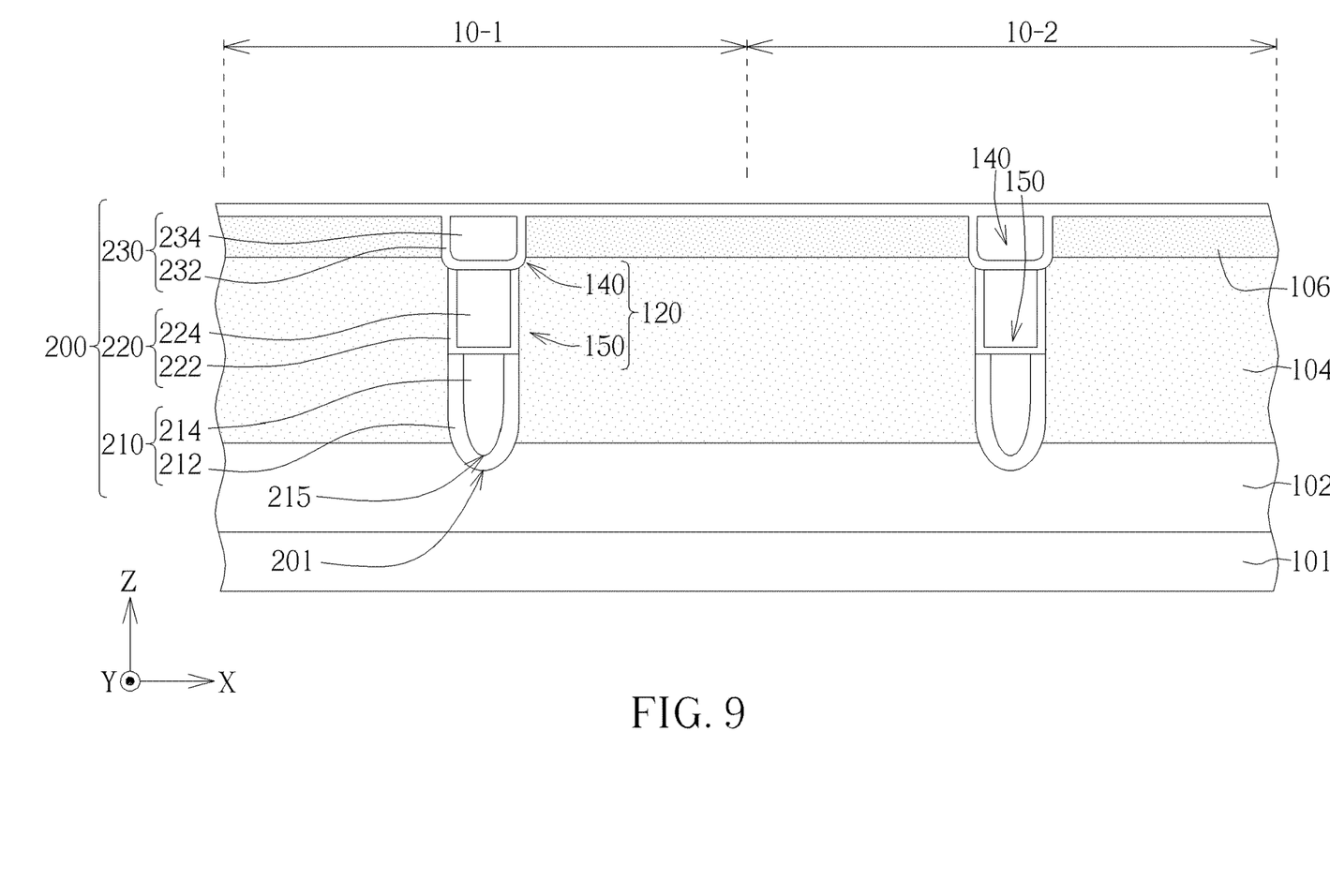

Referring to FIG. 9, at a stage of manufacture shown in FIG. 9, a body doped region 104 of a second conductivity type such as p-type is formed in the epitaxial layer 102 by performing an ion implantation process. The body doped region 104 covers two sides of each lower gate trench 150, and a lowest surface 215 of the first gate electrode 214 is lower than a bottom surface of the body doped region 104. Then, a source doped region 106 of a first conductivity type such as n-type is formed in the epitaxial layer 102 by performing another ion implantation process. The source doped region 104 covers two sides of each upper gate trench 140, and a bottom surface of the third gate structure 230 is lower than a bottom surface of the source doped region 106.

Figure 10:
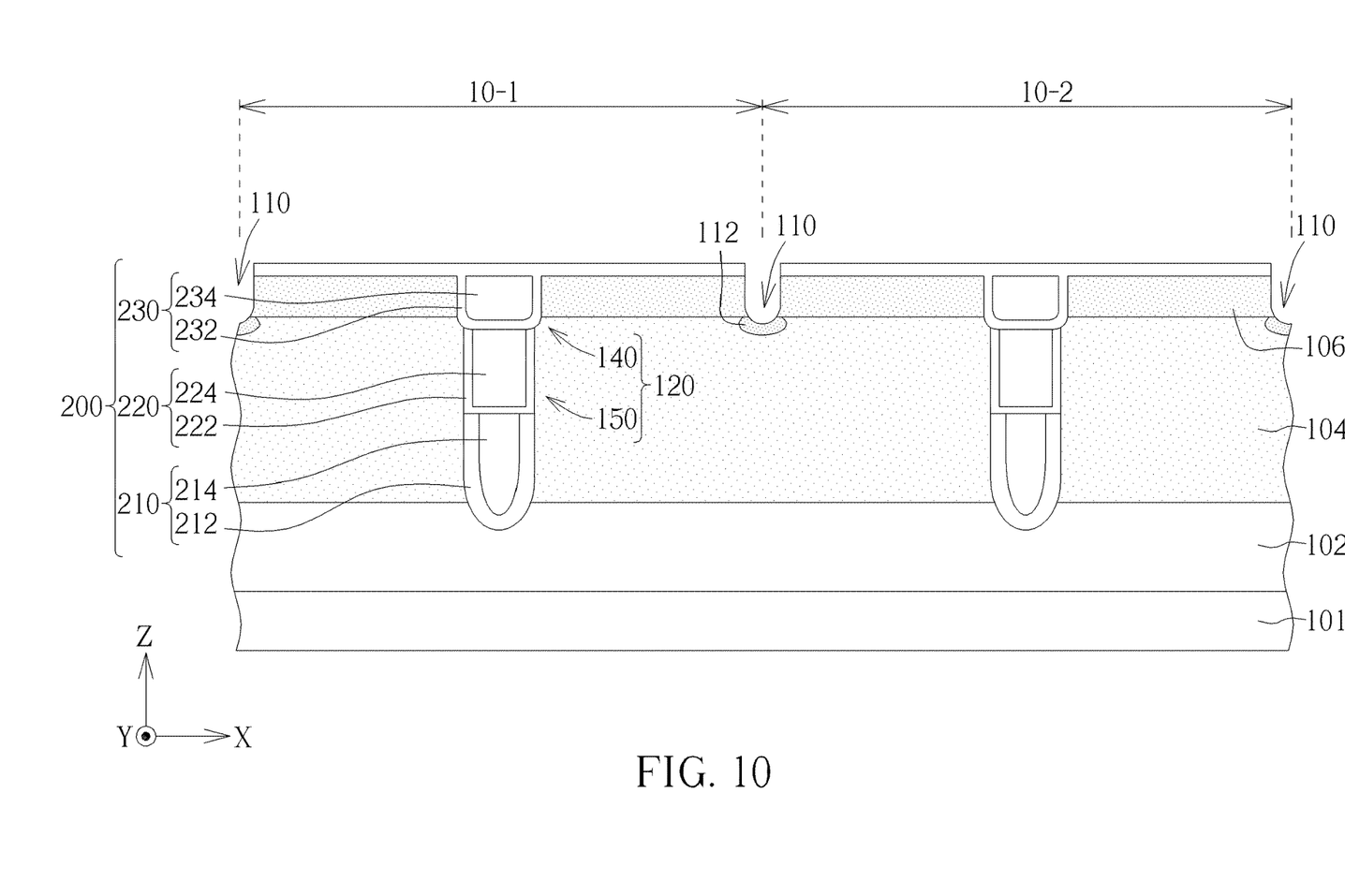

Referring to FIG. 10, at a stage of manufacture shown in FIG. 10, photolithography and etching processes are performed to form a source contact hole 110 in the source doped region 106 between two adjacent trench gate structures 200. Then, by performing an ion implantation process, a heavily doped region 112 of the second conductivity type such as p-type is formed under the source contact hole 110 and between two adjacent trench gate structures 200.

After the stage of manufacture shown in FIG. 10, other fabrication processes can be performed to manufacture a required semiconductor device such as the semiconductor device 100 shown in FIG. 1.

According to some embodiments of the present disclosure, the first, second, and third gate electrodes 214, 224, 234 are separated from one another and can be biased with different voltages to switch on the channel proximate the trench gate structure 200. Besides, since the work function of the first, second, and third gate electrodes 214, 224, 234 may be properly modified, the electric field profile around, especially at the bottom of, the trench gate structure 200 can be modified accordingly. As a result, the one-resistance ($R_{ON}$) of the semiconductor device 100 can be reduced, and the breakdown voltage (BVD) can be enhanced. Besides, the transconductance of the semiconductor device can be improved since the gate dielectric layer near the source doped region is thinner than the gate dielectric layer away from the source doped region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
an epitaxial layer;

at least one gate trench comprising a lower gate trench and an upper gate trench, a width of the lower gate trench being less than a width of the upper gate trench;

at least one trench gate structure disposed in the at least one gate trench, wherein the at least one trench gate structure comprises:

a bottom gate structure disposed in a lower portion of the lower gate trench, wherein the bottom gate structure comprises a first gate electrode and a first gate dielectric layer;

a middle gate structure disposed in an upper portion of the lower gate trench, wherein the middle gate structure comprises a second gate electrode and a second gate dielectric layer, a thickness of the second gate dielectric layer being less than a thickness of the first gate dielectric layer; and a top gate structure disposed in the upper gate trench, wherein the top gate structure comprises a third gate electrode and a third gate dielectric layer, a thickness of the third gate dielectric layer being less than the thickness of the second gate dielectric layer, wherein the first gate electrode, the second gate electrode, and the third gate electrode are separated from each other.

2. The semiconductor device of claim 1, wherein a width of the second gate electrode is greater than a width of the first gate electrode and less than a width of the third gate electrode.

3. The semiconductor device of claim 1, wherein the second gate dielectric layer extends from below the second gate electrode to sidewalls of the lower gate trench.

4. The semiconductor device of claim 1, wherein the top gate structure comprises a curved lower corner extending beyond an upper edge of the middle gate structure.

5. The semiconductor device of claim 1, wherein the third gate electrode comprises a curved lower corner.

6. The semiconductor device of claim 1, wherein the third gate dielectric layer extends from below the third gate electrode to sidewalls of the upper gate trench.

7. The semiconductor device of claim 1, wherein work function of one of the first, second, and third gate electrodes is different from work function of other two of the first, second, and third gate electrodes.

8. The semiconductor device of claim 1, further comprising a body doped region disposed in the epitaxial layer, wherein a bottom surface of the second gate electrode is higher than a bottom surface of the body doped region.

9. The semiconductor device of claim 8, wherein a lowest surface of the first gate electrode is lower than the bottom surface of the body doped region.

10. The semiconductor device of claim 1, further comprising a source doped region disposed in the body doped region, a conductivity type of the source doped region being different from a conductivity type of the body doped region, wherein a top surface of the third gate electrode is higher than a bottom surface of the source doped region.

11. The semiconductor device of claim 1, further comprising a drain contact disposed under the at least one trench gate structure.

12. The semiconductor device of claim 1, wherein the at least one trench gate structure comprises two trench gate structures, and the semiconductor device further comprises a heavily doped region disposed at a top surface of the body doped region and between the trench gate structures, a conductivity type of the heavily doped region is the same as a conductivity type of the body doped region.

13. A method of fabricating a semiconductor device, comprising:

providing an epitaxial layer;

forming an upper gate trench in the epitaxial layer;

forming a lower gate trench in the epitaxial layer, wherein a width of the lower gate trench being less than a width of the upper gate trench;

forming a bottom gate structure in a lower portion of the lower gate trench, wherein the bottom gate structure comprises a first gate electrode and a first gate dielectric layer;

forming a middle gate structure in an upper portion of the lower gate trench, wherein the middle gate structure comprises a second gate electrode and a second gate dielectric layer, a thickness of the second gate dielectric layer being less than a thickness of the first gate dielectric layer; and forming a top gate structure in the upper gate trench, wherein the top gate structure comprises a third gate electrode and a third gate dielectric layer, a thickness of the third gate dielectric layer being less than the thickness of the second gate dielectric layer, wherein the first gate electrode, the second gate electrode, and the third gate electrode are separated from each other.

14. The method of fabricating the semiconductor device of claim 13, wherein forming the bottom gate structure in the lower portion of the lower gate trench comprises:

forming a dielectric material on sidewalls of the upper gate trench and the lower gate trench;

filling the upper gate trench and the lower gate trench with a conductive material; and etching back the dielectric material and the conductive material until top surfaces of the dielectric material and the conductive material are in the lower gate trench.

15. The method of fabricating the semiconductor device of claim 13, wherein forming the middle gate structure in the upper portion of the lower gate trench comprises:

forming a dielectric material on sidewalls of the upper gate trench and on a top surface of the bottom gate structure; and etching back the dielectric material to expose the sidewalls of the upper gate trench.

16. The method of fabricating the semiconductor device of claim 13, wherein a width of the second gate electrode is greater than a width of the first gate electrode and less than a width of the third gate electrode.

17. The method of fabricating the semiconductor device of claim 13, wherein the top gate structure comprises a curved lower corner extending beyond an upper edge of the middle gate structure.

18. The method of fabricating the semiconductor device of claim 13, wherein the third gate electrode comprises a curved lower corner.

19. The method of fabricating the semiconductor device of claim 13, wherein work function of one of the first, second, and third gate electrodes is different from work function of other two of the first, second, and third gate electrodes.

20. The method of fabricating the semiconductor device of claim 13, further comprising forming a body doped region in the epitaxial layer, the body doped region covering two sides of the lower gate trench, wherein a lowest surface of the first gate electrode is lower than a bottom surface of the body doped region.

* * * * *